United States Patent
Srirattana et al.

(10) Patent No.: US 10,256,794 B2
(45) Date of Patent: Apr. 9, 2019

(54) INTEGRATED SWITCH-FILTER NETWORK

(71) Applicant: SKYWORKS SOLUTIONS, INC., Woburn, MA (US)

(72) Inventors: Nuttapong Srirattana, Billerica, MA (US); David Scott Whitefield, Andover, MA (US); David Ryan Story, Ladera Ranch, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/348,635

(22) Filed: Nov. 10, 2016

(65) Prior Publication Data

US 2017/0141759 A1 May 18, 2017

Related U.S. Application Data

(60) Provisional application No. 62/254,956, filed on Nov. 13, 2015.

(51) Int. Cl.
| | | |
|---|---|---|
| *H04B 1/00* | (2006.01) | |
| *H03H 11/04* | (2006.01) | |
| *H03K 17/687* | (2006.01) | |
| *H04B 1/44* | (2006.01) | |
| *H04B 1/48* | (2006.01) | |

(52) U.S. Cl.
CPC ......... *H03H 11/04* (2013.01); *H03K 17/6871* (2013.01); *H04B 1/44* (2013.01); *H04B 1/48* (2013.01)

(58) Field of Classification Search
CPC ......... H04B 1/44; H04B 1/0053; H04B 1/006
USPC .............................................. 455/78, 82, 83
See application file for complete search history.

(56) References Cited

U.S. PATENT DOCUMENTS

| 6,011,959 A * | 1/2000 | Reeser .................. H04B 1/005 |
| | | 333/132 |
| 2006/0073792 A1* | 4/2006 | Schoning ............... H04B 1/525 |
| | | 455/83 |
| 2013/0130630 A1 | 5/2013 | Crandall |
| 2013/0188650 A1 | 7/2013 | Sugiura |
| 2013/0241666 A1* | 9/2013 | Granger-Jones .......... H01P 1/15 |
| | | 333/101 |

(Continued)

FOREIGN PATENT DOCUMENTS

| JP | 2005-136948 A | 5/2005 |
| JP | 2006-511179 A | 3/2006 |

OTHER PUBLICATIONS

International Search Report and Written Opinion dated Mar. 2, 2017 for PCT/US2016/061448.

*Primary Examiner* — Ping Y Hsieh

(74) *Attorney, Agent, or Firm* — Chang & Hale LLP

(57) ABSTRACT

A radio-frequency module includes a switching device having first and second switch arms and a common pole node connected to both the first and second switch arms, a first shunt arm connected to the first switch arm, and a first transmission line disposed in the first switch arm between the common pole node and the first shunt arm, the first transmission line being configured to present a substantially open circuit looking into the first switch arm from the common pole node at a fundamental frequency of a signal transmitting on the second switch arm when the first switch arm is in an OFF-state and the first shunt arm is in an ON-state.

15 Claims, 10 Drawing Sheets

(56) References Cited

U.S. PATENT DOCUMENTS

2015/0303978 A1 10/2015 Chen
2015/0381168 A1* 12/2015 Uejima ............... H03K 17/687
　　　　　　　　　　　　　　　　　　　455/78

* cited by examiner

INTEGRATED SWITCH-FILTER NETWORK

CROSS-REFERENCE TO RELATED APPLICATION(S)

This application claims priority to U.S. Provisional Application No. 62/254,956, filed Nov. 13, 2015, and entitled INTEGRATED SWITCH-FILTER NETWORK, the disclosure of which is hereby incorporated by reference in its entirety.

BACKGROUND

Field

The present disclosure relates to field-effect transistor (FET) devices such as silicon-on-insulator (SOI) devices.

Description of the Related Art

In electronics applications, field-effect transistors (FETs) can be utilized as switches. Such switches can allow, for example, routing of radio-frequency (RF) signals in wireless devices.

SUMMARY

In accordance with a number of implementations, the present disclosure relates to a radio-frequency module comprising a switching device having first and second switch arms and a common pole node connected to both the first and second switch arms, a first shunt arm connected to the first switch arm, and a first transmission line disposed in the first switch arm between the common pole node and the first shunt arm, the first transmission line being configured to present a substantially open circuit looking into the first switch arm from the common pole node at a fundamental frequency of a signal transmitting on the second switch arm when the first switch arm is in an OFF-state and the first shunt arm is in an ON-state.

In certain embodiments, the first transmission line has a length of $\frac{1}{4}\lambda$, where $\lambda$ represents a wavelength associated with the fundamental frequency. In certain embodiments, the first transmission line has a length of $\frac{3}{4}\lambda$, where $\lambda$ represents a wavelength associated with the fundamental frequency.

The first transmission line may be further configured to present a substantially short circuit looking into the first switch arm from the common pole node at at least one harmonic of the fundamental frequency. The first shunt arm may include a switch in series with a tank circuit connected to ground, the tank circuit being configured to resonate at the at least one harmonic of the fundamental frequency and present a substantially short circuit to ground at the fundamental frequency. The tank circuit may include a capacitor in parallel with an inductor.

In certain embodiments, the radio-frequency module further comprises a second shunt arm connected to the second switch arm. The radio-frequency module may further comprise a second transmission line disposed in the second switch arm between the common pole node and the second shunt arm, the second transmission line being configured to present a substantially open circuit looking into the second switch arm from the common pole node at a fundamental frequency of a signal transmitting on the first switch arm when the second switch arm is in an OFF-state and the second shunt arm is in an ON-state.

The first shunt arm of the radio-frequency module may be connected to a plurality of transmission paths, each of the plurality of transmission paths including a switch for transmitting a signal corresponding to a different frequency band.

In certain embodiments, the first transmission line includes an inductor-capacitor network. The inductor-capacitor network may include a first shunt capacitor, a second shunt capacitor, and an inductor disposed between the first and second shunt capacitors.

In some implementations, the present disclosure relates to a switching circuit comprising a first switch arm, a second switch arm, a common pole node connected to both the first and second switch arms, a first shunt arm connected to the first switch arm, and a first transmission line disposed in the first switch arm between the common pole node and the first shunt arm, the first transmission line being configured to present a substantially open circuit looking into the first switch arm from the common pole node at a fundamental frequency of a signal transmitting on the second switch arm when the first switch arm is in an OFF-state and the first shunt arm is in an ON-state.

In certain embodiments, the first transmission line has a length of $(x/4)\cdot\lambda$, where $\lambda$ represents a wavelength associated with the fundamental frequency and x represents an integer value. The switching circuit of claim 12 wherein the first transmission line is further configured to present a substantially short circuit looking into the first switch arm from the common pole node at at least one harmonic of the fundamental frequency. The first shunt arm may include a switch in series with a tank circuit connected to ground, the tank circuit being configured to resonate at the at least one harmonic of the fundamental frequency and present a substantially short circuit to ground at the fundamental frequency. The tank circuit may include a capacitor in parallel with an inductor.

The switching circuit may further comprise a second shunt arm connected to the second switch arm. The switching circuit may further comprise a second transmission line disposed in the second switch arm between the common pole node and the second shunt arm, the second transmission line being configured to present a substantially open circuit looking into the second switch arm from the common pole node at a fundamental frequency of a signal transmitting on the first switch arm when the second switch arm is in an OFF-state and the second shunt arm is in an ON-state. In certain embodiments, the first switch arm corresponds to band 8 of the LTE spectrum and the second switch arm corresponds to band 17 of the LTE spectrum.

In some implementations, the present disclosure relates to a wireless device comprising an antenna configured to transmit a radio-frequency output signal, a first switch arm coupled to the antenna via a pole node, a second switch arm coupled to the antenna via the pole node, a first shunt arm connected to the first switch arm, and a first transmission line disposed in the first switch arm between the pole node and the first shunt arm, the first transmission line being configured to present a substantially open circuit looking into the first switch arm from the pole node at a fundamental frequency of the radio-frequency output signal when the first switch arm is in an OFF-state and the first shunt arm is in an ON-state.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION OF SOME EMBODIMENTS

The headings provided herein, if any, are for convenience only and do not necessarily affect the scope or meaning of the claimed invention.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

In radio frequency (RF) switch circuits, ON-state devices may generally present an ON-resistance that is non-linear. ON-resistance may be reduced by implementing larger devices sizes, which may provide improved IDSS, reduced ON-resistance, and/or other benefits. However, large devices may undesirably require additional space, and may still generate some levels of non-linearity (e.g., harmonics and/or intermodulation distortion (IMD)). In addition, OFF-capacitance can present non-linearities, including harmonics and/or intermodulation distortion, particularly under relatively large voltage swings. The stacking of multiple transistors (e.g., field-effect transistors (FETs)) in an OFF-state switch arm can reduce voltage drop across each transistor. However, stacking multiple transistors can increases size; multiple switch arms may need to include transistor stacks in such implementations.

Passive filters may be used for post-switch filtering of harmonics. However, where such filter(s) are positioned at a common port, multiple switch arms may see the same filter (e.g., having the same added insertion loss, filter rejection/ response, etc.), and therefore filter characteristics/response may not be optimizable for different switch arms, which may correspond to different frequency bands of operation, for example. Certain embodiments disclosed herein provide for an alternative to post-switch filtering using integrated switch-filter networks.

RF Switches

Figure 1:
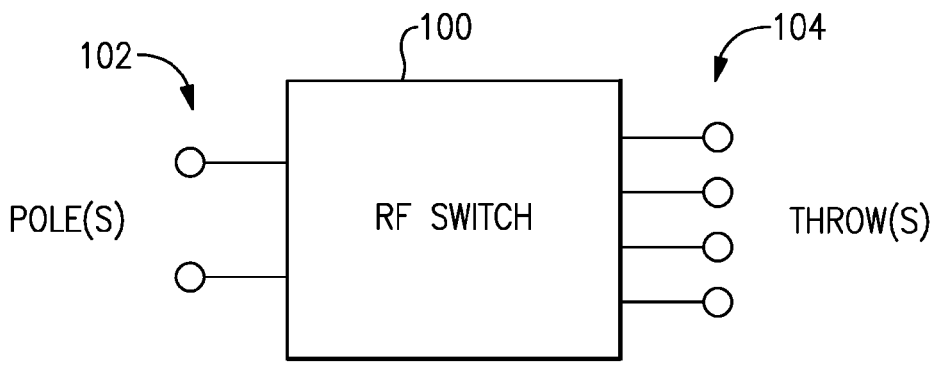
FIG. 1 schematically shows a radio-frequency (RF) switch configured to switch one or more signals between one or more poles and one or more throws according to one or more embodiments.

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 2:
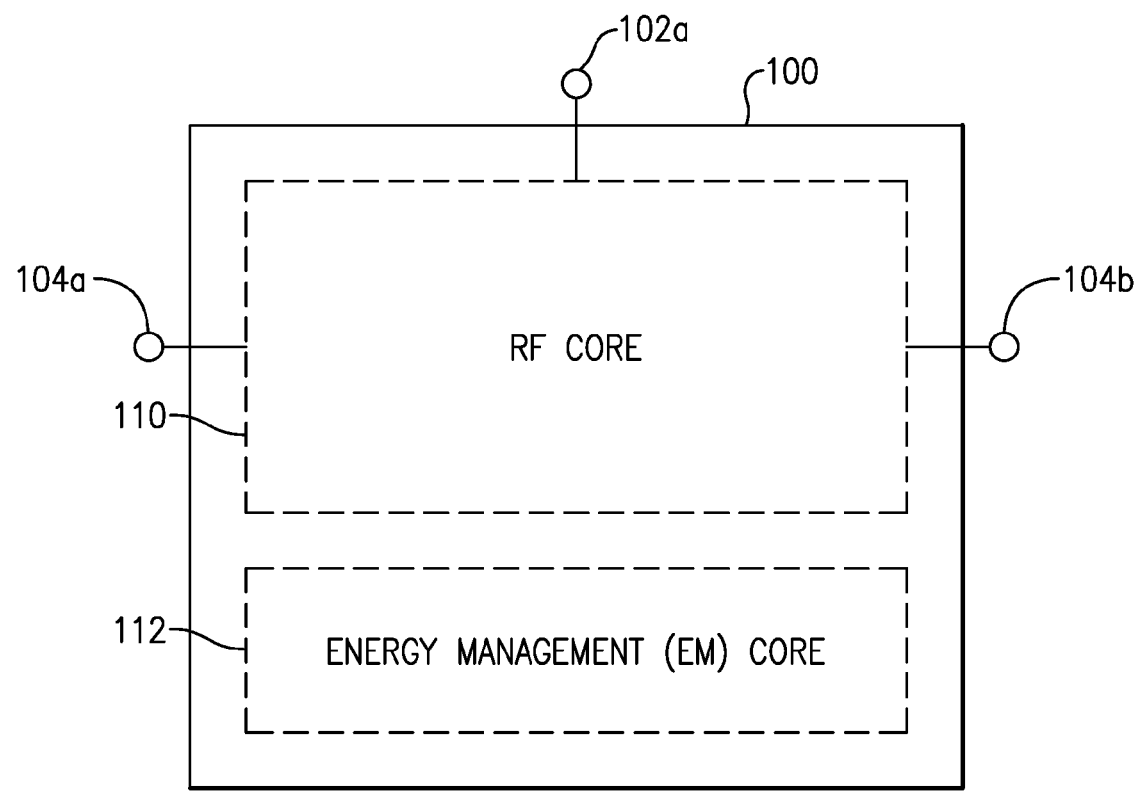
FIG. 2 shows an RF switch including an RF core and an energy management core according to one or more embodiments.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, the EM core 112 can be configured to supply, for example, voltage control signals to the RF core. The EM core 112 can be further configured to provide the RF switch 100 with logical decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
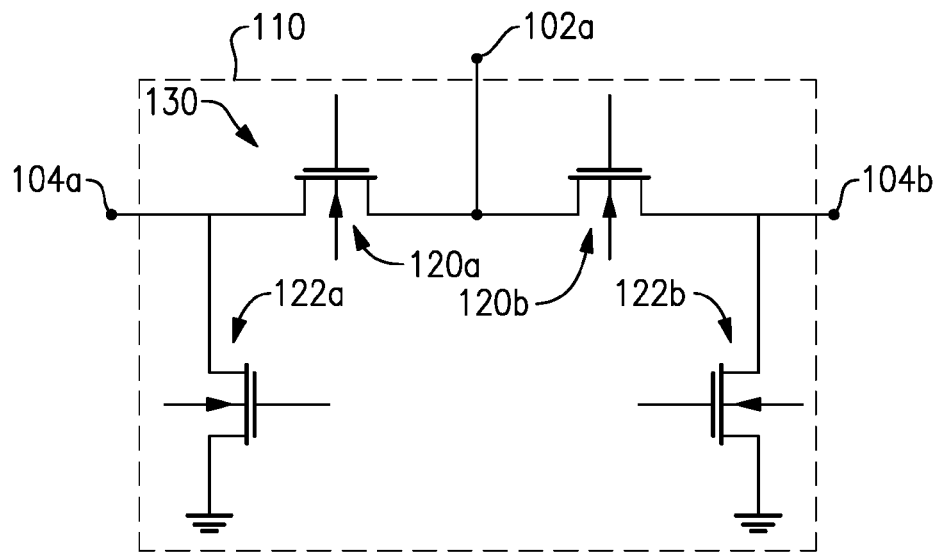
FIG. 3 shows a configuration of an RF core according to one or more embodiments.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via a FET 122a to provide shunting capability for the node 104a. Similarly, the second throw node 104b is shown to be coupled to the RF ground via an FET 122b to provide shunting capability for the node 104b. The first and second throw nodes may further each be coupled to an RF signal associated with a separate RF transmission band in certain embodiments.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

Figure 4:
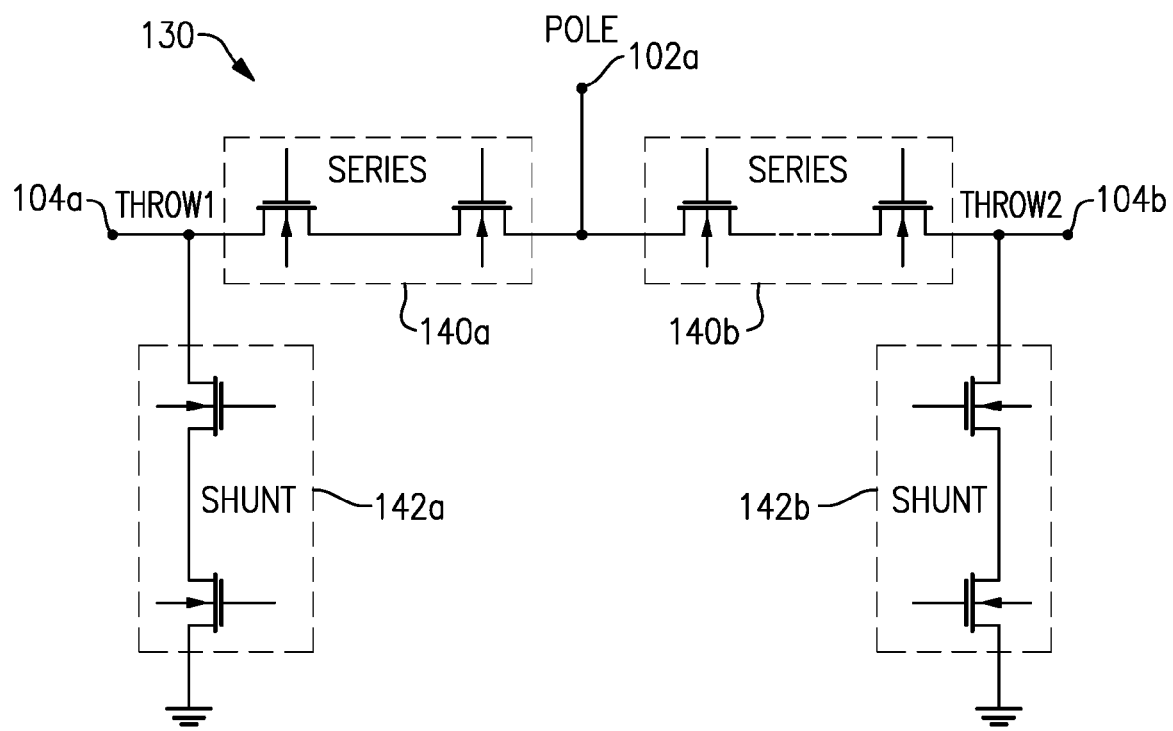
FIG. 4 shows a configuration of an RF core according to one or more embodiments.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs, configured in a transistor stack. Such a configuration is illustrated in FIG. 4, where series switches (140a, 140b) and/or shunt switches (142a, 142b) may include multiple transistor devices in series. Again, although described in the context of an SP2T configuration, it will be understood that RF cores having other numbers of poles and throws can also be implemented.

Where a certain signal is desired to be transmitted to the antenna, the path between the associated throw and the antenna may be biased ON, while other switches not being currently used will be biased OFF. Furthermore, shunt arms associated with the OFF arm(s) may be connected to ground to further isolate the path of interest. However, with respect to the configuration of the switch 110 circuit of FIG. 3 and the switch 130 of FIG. 4, where a series switch (e.g., 120a, 120b) is disposed in the transmit arm between the antenna node and the respective shunt arm, linearity issues may arise based on harmonics and/or intermodulations that may be generated by the series switch(es) transmitting the signal of interest in the ON arm, as well as the voltage swing that may be present in the OFF arm(s). Certain embodiments are disclosed herein that provide for an integrated switch and filter architecture, which may at least partially eliminate the need for series transistors in ON switch arms and/or reduce the voltage swing across OFF arm switches. Integrated filter-switch networks as described herein may at least partially improve switching performance with respect to one or more switching performance parameters, such as those described below.

Examples of Switching Performance Parameters:

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1+f_2$, $f_2-f_1$, $2f_1$, and $2f_2$. A third-order IMD (also referred to as IMD3) is typically considered to include $2f_1+f_2$, $2f_1-f_2$, $f_1+2f_2$, $f_1-2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

Non-Linearity Correction/Prevention Using Integrated Switch-Filter Networks

As described above, in RF switches, OFF-state isolation between an input port and an output port may be a substantial factor in determining switch performance. OFF-state switch isolation may provide a measure of the RF isolation between an input port and an output port of the switch. In some embodiments, OFF-state switch isolation may provide a measure of the RF isolation of a switching device while the switching device is in a state where an input port and an output port are electrically isolated, for example while the switching device is OFF. Increased switching device isolation may result in improved RF signal integrity, and may provide improvement in wireless communication device performance.

Isolation may be negatively affected by parasitic capacitances in transistor devices. For example, with further reference to FIG. 3, when the transistor 120a or 120b is in an OFF-state, wherein drain-to-source current in the transistor is substantially inhibited, parasitic capacitances may exist between one or more terminals of the transistor, which can negatively impact performance of the RF core 110. For example, OFF-state capacitance (also referred to herein as "OFF capacitance," or "$C_{OFF}$"), together with the resistances in the circuit, may at least partially limit the speed of the transistor. Various parasitic capacitances of the transistors 120a, 120b may be created at least in part by the depletion regions between source/drain and bulk substrate of the transistors.

In order to reduce ON-arm switch harmonics, certain switch circuit embodiments implement relatively large periphery transistors (e.g., high IDSS and/or reduced on resistance). However, drawbacks associated with such implementations may include relatively large device/chip size. Furthermore, such solutions may not sufficiently eliminate ON-arm generated harmonics. In addition, larger arm size can cause an increase in OFF-state capacitances, create impedance mismatches resulting in relatively high insertion loss and/or low isolation, and/or result in increased OFF-arm-generated non-linearity.

In order to reduce OFF-arm harmonics, certain switch circuit embodiments utilize several stacks of transistors in each switch arm to divide the voltage drop across each transistor. However, such solutions may generally result in an increased switch size and/or increased ON-resistance when the switch is in an ON-state. In order to achieve relatively low harmonics, certain implementations utilize a passive RF filter as a post-switch harmonics filtering solution. However, using post-switch filtering may further increase insertion loss and/or fixed filter response, which may not be desirable for implementing on multiple bands of transmission.

As described above, switch circuit implementations such as are shown in FIGS. 3 and 4, in which one or more series switches are disposed in transmit arms, such switch(es) may substantially unavoidably generate some amount of harmonics based on the ON-resistance for the ON-arm and/or OFF-capacitance for OFF-arm. That is, generally speaking, FET devices (e.g., SOI or pHEMT, or any semiconductor transistor), when used as switches, may generate some amount of non-linearity.

Certain embodiments disclosed herein provide for integrated switch and filter switch architectures, which may substantially avoid ON-switch harmonic generation by not including a series switch between a shunt arm and a common node. Without one or more series switches, other solutions may be implemented to turn ON and OFF switch transmit arms. In certain embodiments, switching/filtering functionality may be achieved at least in part through the use of series transmission line(s), which may be dimensioned to provide desired filtering characteristics at certain frequencies. As is understood by those having ordinary skill in the art, for a transmission line having a length of ¼ wavelength (λ) with respect to a particular frequency component of a signal, such frequency component will see the opposite of the termination impedance when looking into the transmission line.

Figure 5:
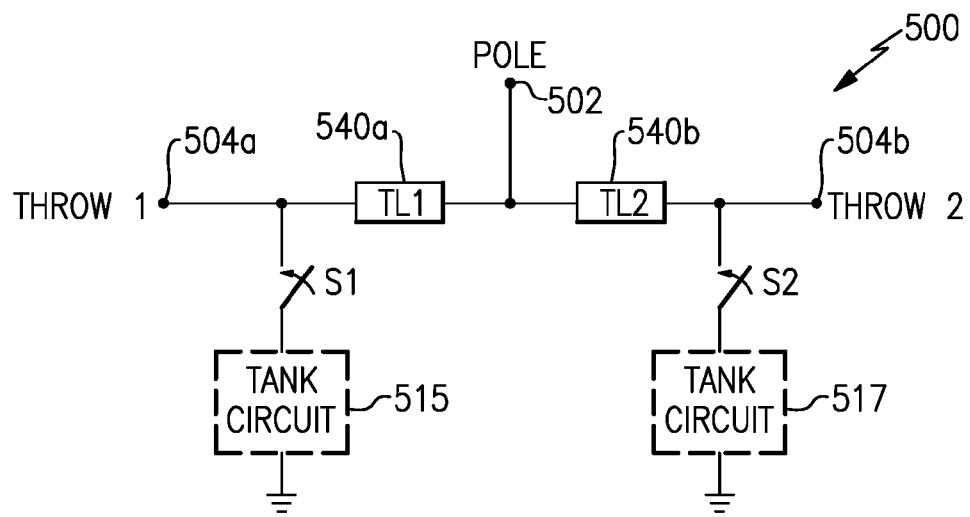
FIG. 5 shows an example of an RF core according to one or more embodiments.

FIG. 5 shows an example of an RF core according to one or more embodiments. The switch circuit 500 includes one or more transmission lines ("TL1," "TL2") as an alternative to series switches. Therefore, the switch 500 may not present the ON-state harmonic generation described above. The switch circuit 500 may use the transmission line(s), or equivalents thereof, to create phase delay, and use a tank circuit 515, 517 (e.g., LC network), which may be used in an OFF-condition to form open and/or short impedances for the OFF (e.g., high linearity) path. Such implementations may result in reduced voltage swing at other OFF-state switches. The tank circuit 515 may serve to eliminate the harmonics generated by the switch S1 in the shunt arm.

Figure 6:
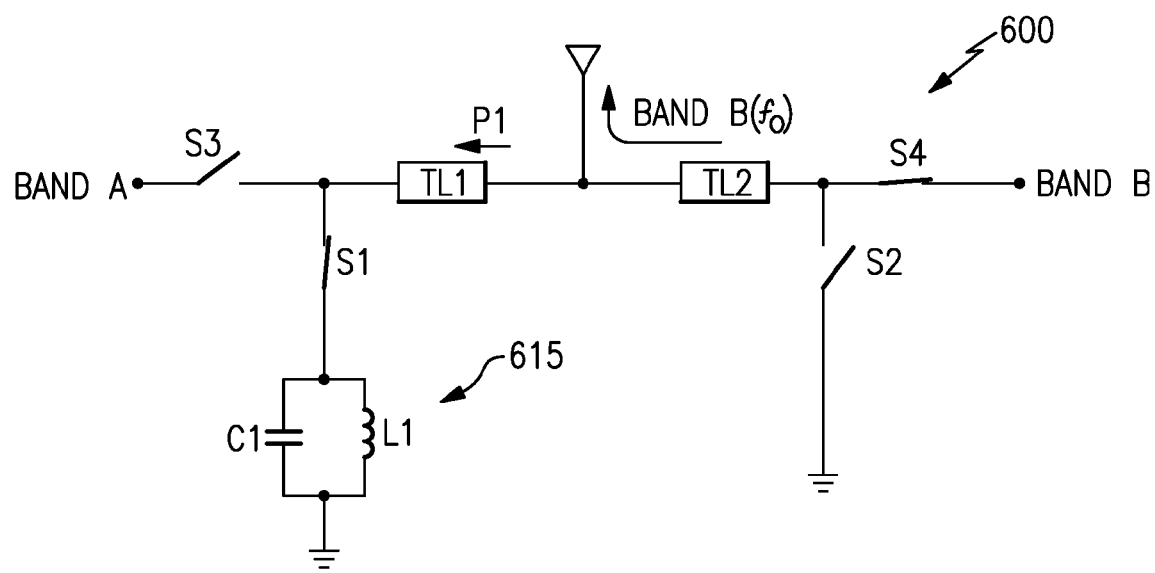
FIG. 6 shows an example of a switch circuit according to one or more embodiments.

FIG. 6 provides an example embodiment of a switch circuit 600 which demonstrates certain principles disclosed herein. The switch circuit 600 includes two switch arms, one being associated with a first transmission band ("Band A") and the other being associated with a second transmission band ("Band B"). Although two bands/arms are shown, it should be understood that the principles disclosed may be applicable in solutions including any number of bands/arms.

In an implementation, it may be desirable to minimize the third harmonic ($3f_0$) (or other harmonic) of Band B, and minimize the second harmonic ($2f_0$) (or other harmonic) of Band A. For example, a particular harmonic may be close to another signal propagating somewhere in the system, such that rejection of such signal may be desirable to prevent unwanted leakage to other parts of the system. In one embodiment, Band A may correspond to band 8 of the LTE spectrum (e.g., approximately 900 MHz), while Band B may correspond to band 17 of the LTE spectrum (e.g., approximately 700 MHz). One or more additional linear paths may be formed with more transmission (delay) line transformation networks.

For the switch arm associated with Band B, there may be no series switch in the transmission path, such that generally no series-arm harmonic generation may be experienced. It may also be desirable to minimize OFF-state voltage across any other OFF-state series arms to improve OFF-arm harmonics. As stated above, in an example implementation, it may be desirable to provide $3f_0$ harmonic rejection of the Band B signal. For the switch arm associated with Band A, it may be desirable to provide $2^{nd}$ harmonic rejection, while still passing the associated passband.

Using a ¾λ transmission line for TL1, or an LC circuit equivalent, in combination with a parallel resonance tank circuit 615, the resulting impedance environment may present, from a direction P1 looking into the transmission line TL1, a substantially open circuit for the fundamental frequency ($f_0$) of Band B, and a short circuit at the $3^{rd}$ harmonic ($3f_0$).

The parallel tank circuit 615 may be configured to resonate at the frequency that is desired to be rejected (e.g., $3f_0$ for Band B; 2.1 GHz in an embodiment), whereas the tank circuit 615 may look like a substantially short circuit to ground at the fundamental frequency $f_0$ of Band B. For example, such behavior may be achieved through the use of a relatively low-value inductor L1.

The circuit 600 may present substantially no ON-arm transistor-generated harmonics or intermodulation distortion for the high linear arm (e.g., Band B). Furthermore, OFF-arm switches, such as S3, may see relatively minimum voltage swing from the fundamental signal transmitted by the high linear arm. This may minimize OFF-arm-generated non-linearity (e.g., harmonics and/or intermodulation distortion). Furthermore, in other modes (e.g., not the high linear arm path), harmonic rejection may be achieved (e.g., $2f_0$ or $3f_0$, depending on the design), such that no post-switch filtering may be necessary.

Figure 7:
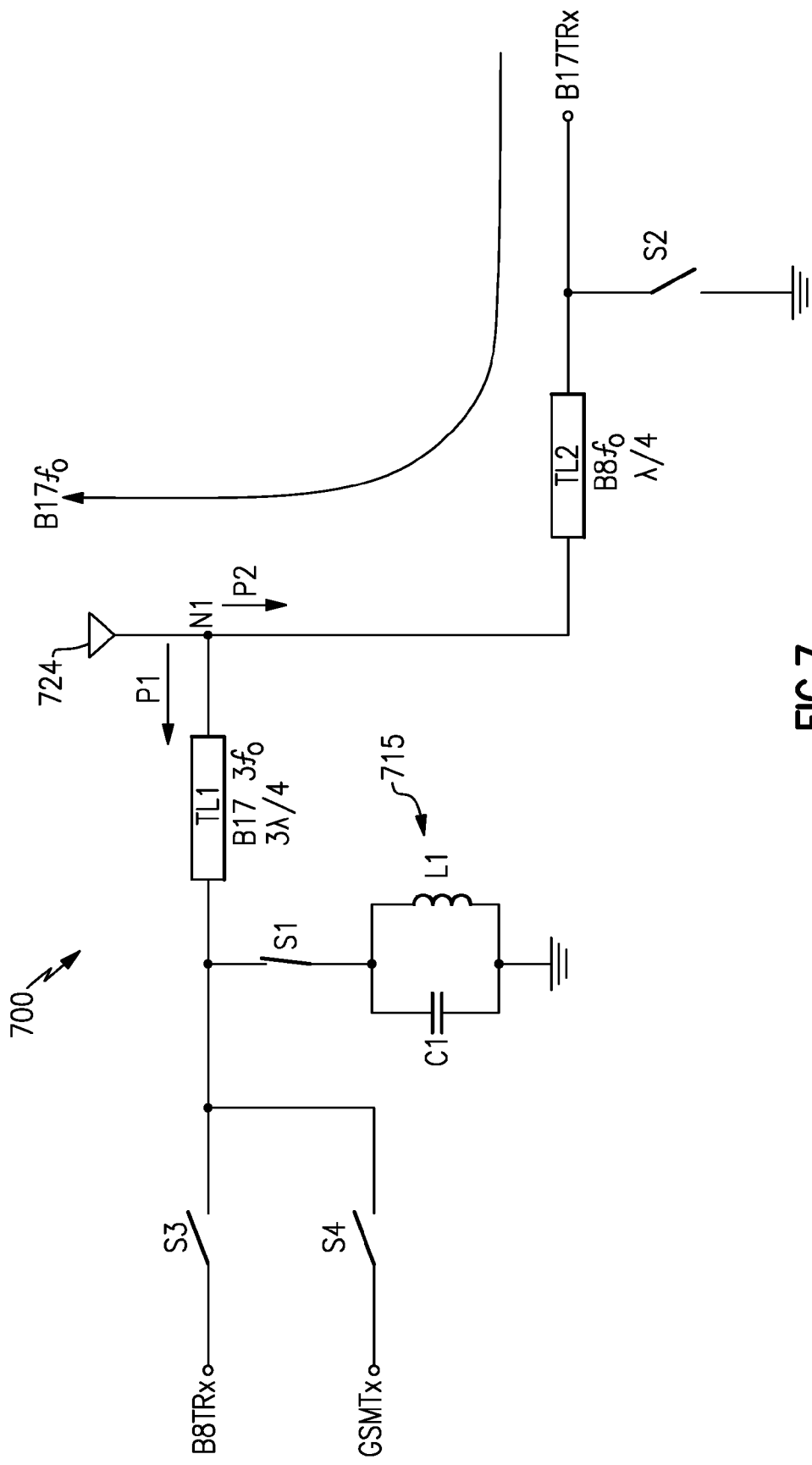
FIG. 7 shows an example of an RF core according to one or more embodiments.

FIG. 7 shows an example of an RF core according to one or more embodiments. The particular implementation of FIG. 7 includes three switch arms: (1) Band 17 (B17), for which minimized ON-harmonic generation for the $3^{rd}$ harmonic of the transmission signal may be desirable in one or more applications; Band 8 (B8), for which $2^{nd}$ harmonic rejection may be desirable in one or more applications; and an additional low-band GSM arm.

As shown, there may be no series arm switch between the antenna 724 and the shunt switch S1, or between the antenna 724 and the shunt switch S2, and therefore there may be reduced or no series-arm harmonic generation in such path. Furthermore, OFF-state voltage across the various arms may also be reduced/minimized, improving OFF-arm harmonics.

In certain embodiments, the transmission line TL1 may comprise a ¾λ transmission line with respect to the B17 band fundamental frequency in order to present a short circuit for the $3^{rd}$ harmonic for the B17 band from the perspective P1, while the transmission line TL2 may comprise a ¼λ transmission line with respect to the B8 and/or GSM bands to provide a short circuit for the $2^{nd}$ harmonic (e.g., 1.8 GHz) of such band(s).

In the example of FIG. 7, a B17 band transmission signal centered at $f_0$ (e.g., 700 MHz) may pass through the transmission line TL2 (which may have a length of ¼λ for the B8 band) and to the antenna 724. Because there is no series switch, there may be substantially no ON-state harmonic generation; although there may be a shunt switch S2, such switch may be in an OFF-state during B17 transmission.

In order to make the B17 band transmit path a relatively low-loss path, the transmission line TL1 may be dimensioned to present a short circuit at the $3^{rd}$ harmonic for B17 (e.g., 2.1 GHz) at the common node N1 in the direction P1. With the shunt switch S1 in an ON-state, the $3^{rd}$ harmonic signal may be passed to a tank circuit designed to resonate at the $3^{rd}$ harmonic of the B17 signal, and therefore appears as an open circuit to the $3^{rd}$ harmonic frequency component, while appearing as a short circuit to ground to the fundamental frequency. The tank circuit 715 may comprise a relatively large-value inductor and a small-value capacitor in order to achieve the desired resonance.

In a B8 band transmit mode, the switch S1 coupled to the tank circuit 715 may be open, whereas the opposite-side shunt switch S2 may be closed to ground. The transmission line TL2 may be designed to appear as an open circuit at the common node N1 to the fundamental frequency of the B8 band. Although not shown in the diagram, the switch S2 may likewise be coupled in series with a tank circuit designed to resonate at a harmonic interval that is desired to be rejected. The lengths of the various transmission lines (TL1, TL2) may be selected to provide the optimal signal rejection characteristics.

Figure 8:
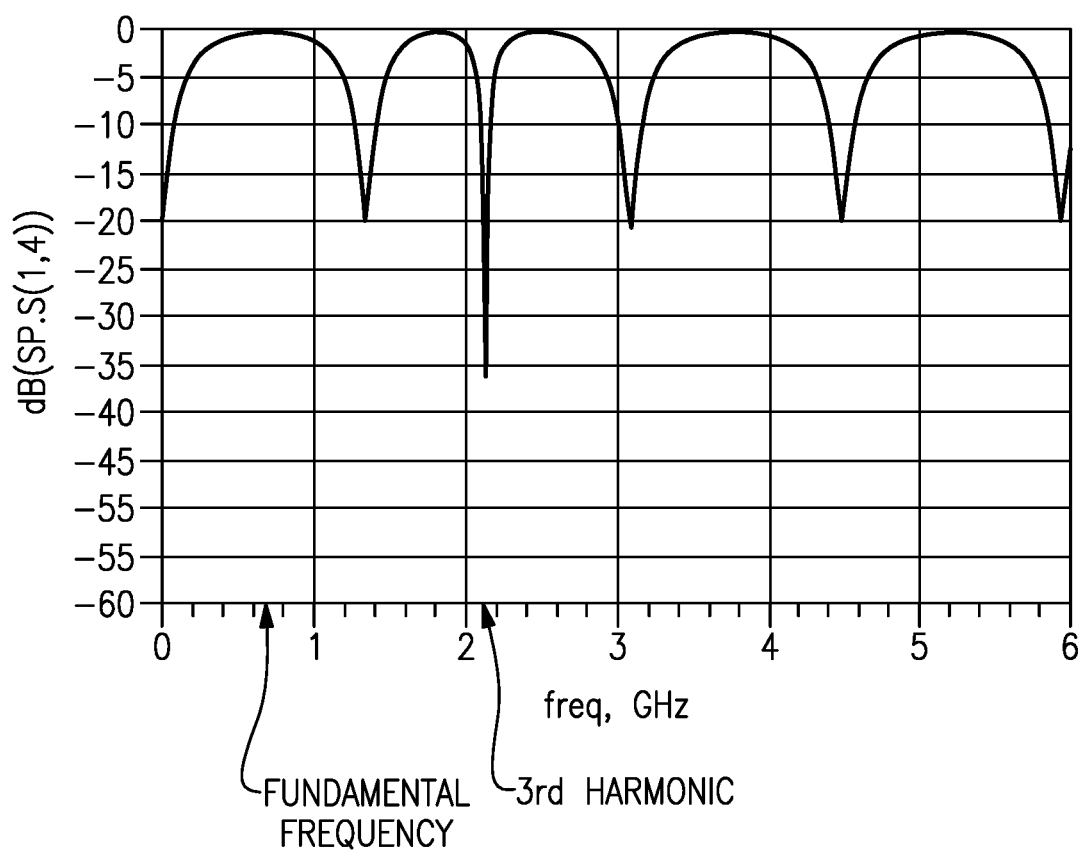
FIG. 8 is a graph showing example signal rejection provided by a transmission line according to one or more embodiments.

FIG. 8 is a graph showing the signal rejection provided by the transmission line TL1 of FIG. 7 according to one or more embodiments. As shown, in an embodiment, a transmission line having a length of ¾λ may provide a null (e.g., up to −35 dB or more rejection) at the $3^{rd}$ harmonic frequency component, while the fundamental frequency may be passed with little or no loss.

Figure 9B:
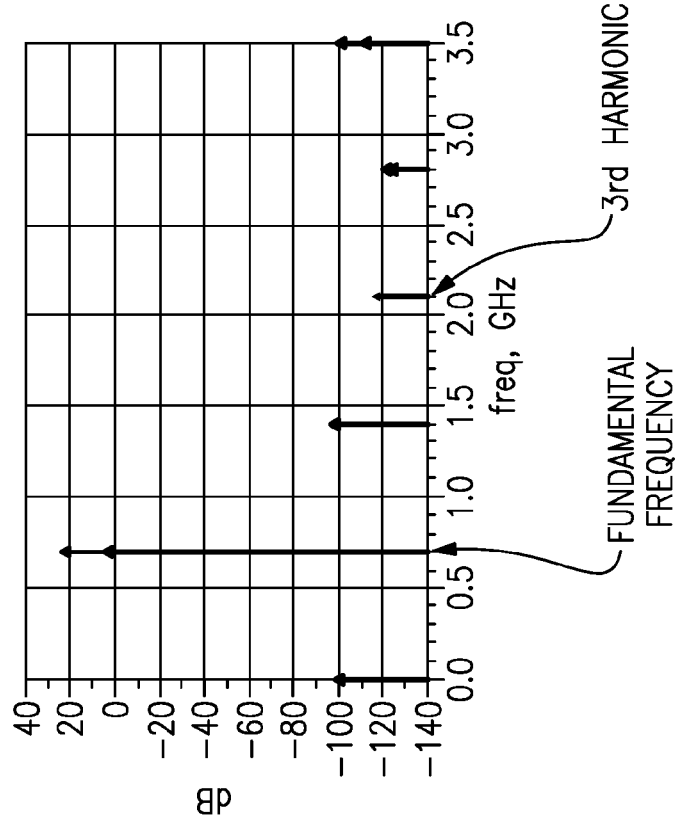
FIGS. 9A and 9B are graphs showing potential harmonic magnitudes for a system implementing series switch(es) and a system implementing an integrated switch-filter network, respectively, according to various embodiments.
Figure 9A:
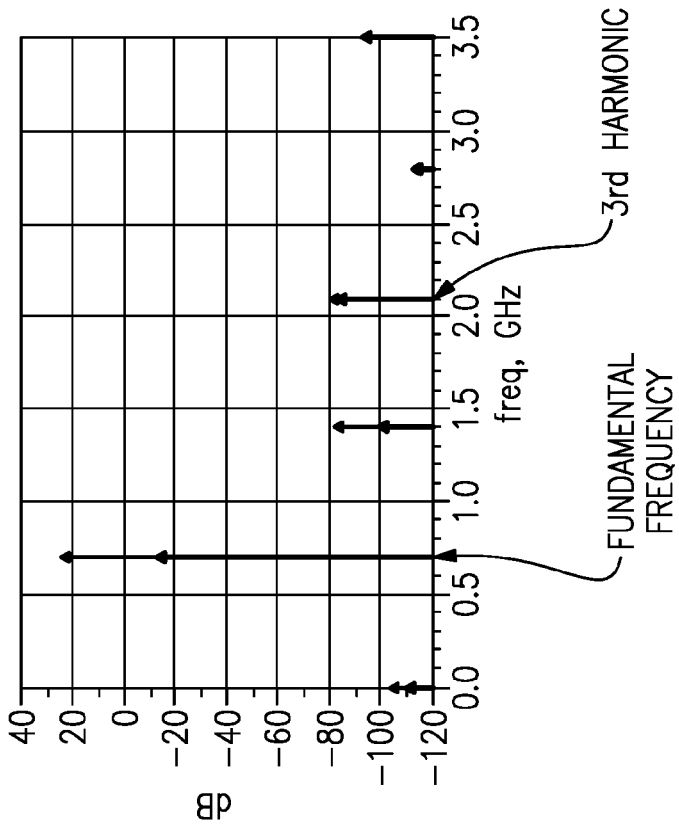

FIGS. 9A and 9B are graphs showing potential harmonic magnitudes for a system implementing series switch(es) and a system implementing an integrated switch-filter network, respectively. As demonstrated in FIG. 9B, in certain embodiments, the $3^{rd}$ harmonic may be reduced by 30 dB or more in an integrated switch-filter system compared to a traditional series switch system.

Figure 10:
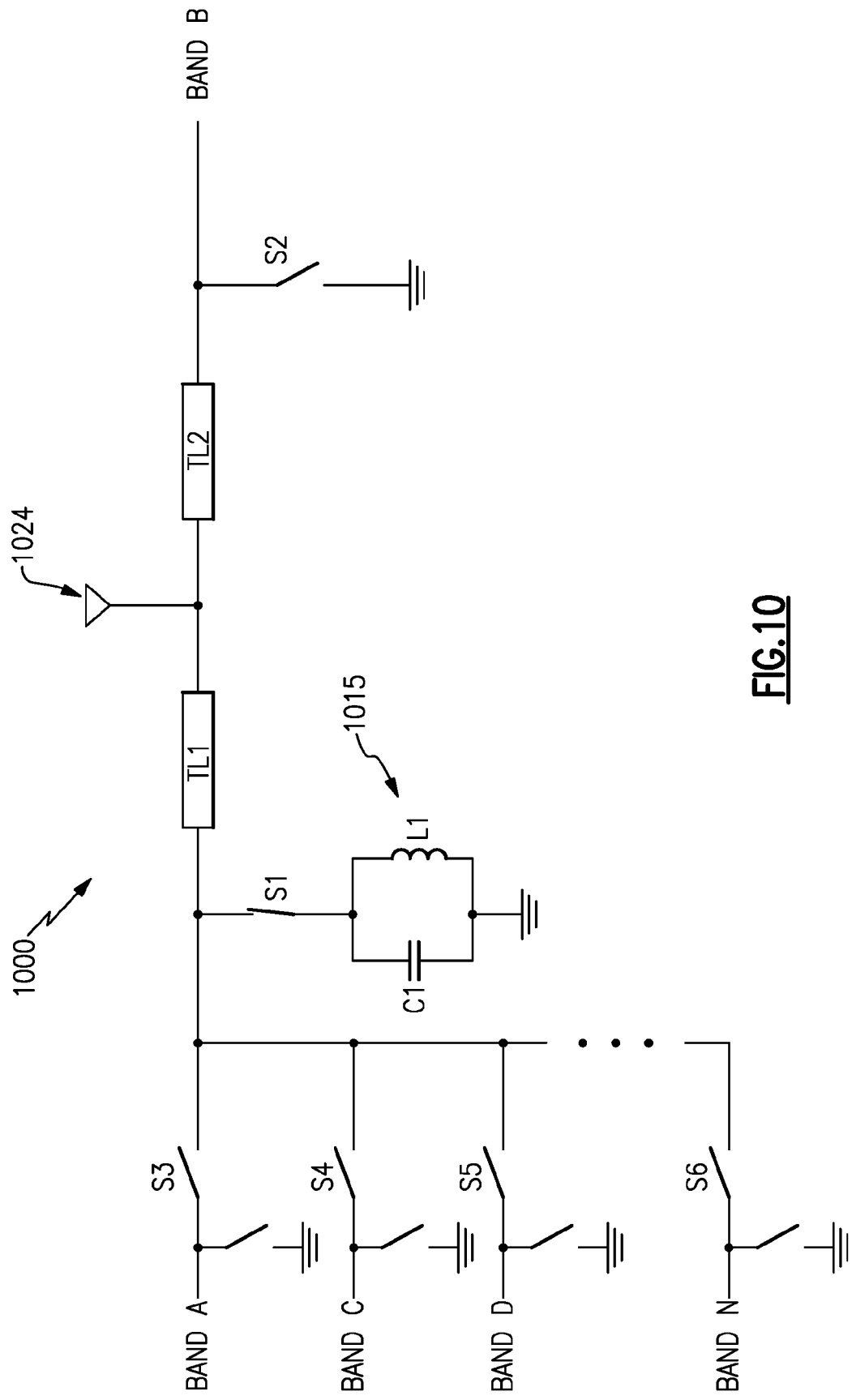
FIG. 10 shows an example of an RF core according to one or more embodiments.

FIG. 10 shows an example of an RF core 1000 according to one or more embodiments. The circuit of FIG. 10 demonstrates that, in certain embodiments, where additional transmission bands are part of the RF core, such additional arms may be placed on a single side. For example, where Bands A and C represent B8 and GSM bands, respectively, additional bands may be grouped together on the same side.

Figure 11A:
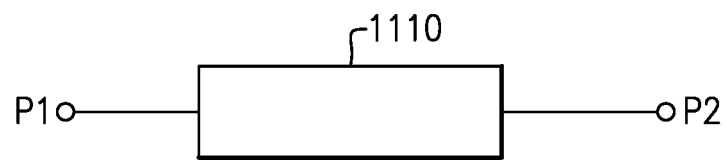
FIG. 11A shows a representation of a transmission line according to one or more embodiments.
Figure 11B:
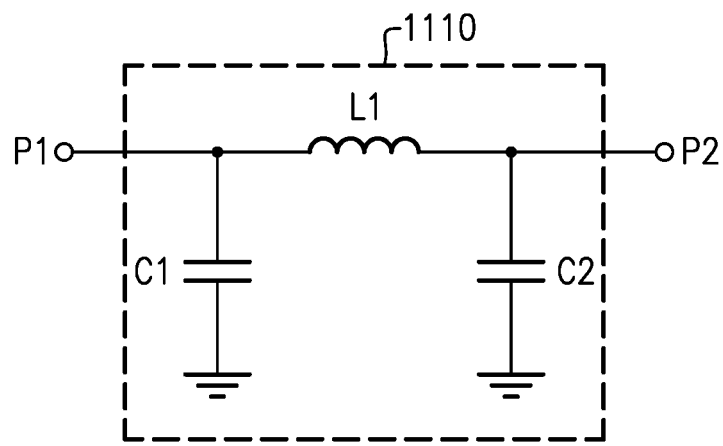
FIG. 11B shows a transmission line equivalent circuit including one or more capacitors and/or inductors according to one or more embodiments.

FIG. 11A shows a representation of a transmission line, whereas FIG. 11B shows that, in certain embodiments, a transmission line equivalent circuit including one or more capacitors and/or inductors may be used in connection with one or more embodiments disclosed herein to provide the transmission line functionality disclosed herein. Any references to, or descriptions of, transmission lines in connection with embodiments disclosed herein may be understood to references to transmission line equivalent circuits, such as that shown in FIG. 11B, or other type or configuration of transmission line equivalent circuit.

In certain embodiments, one or more of the capacitors C1, C1 of FIG. 11B may have a value of $$Cp = \frac{1}{2\pi fZ},$$

wherein Z represents the characteristic impedance of the transmission line and f represents the center frequency. Furthermore, the inductor L1 may have a value of $$Ls = \frac{Z}{2\pi f}$$

in certain embodiments.

Packaged Module Implementation

Figure 12A:
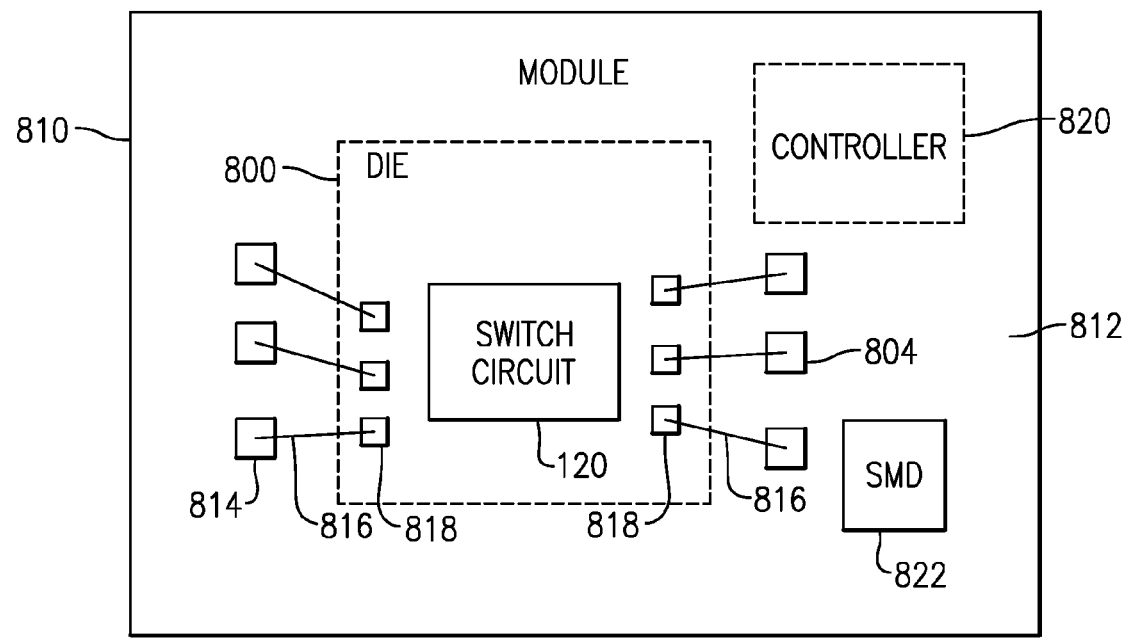
FIGS. 12A and 12B show a plan view and a side view, respectively, of a packaged module according to one or more embodiments.
Figure 12B:
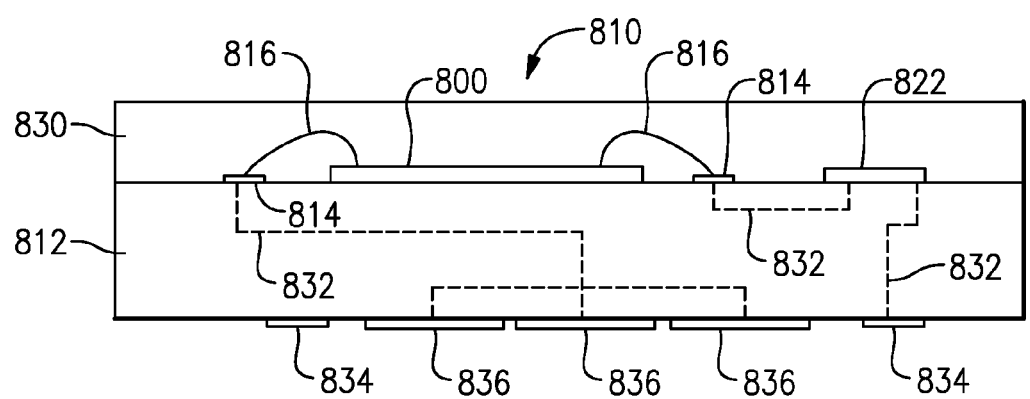

In some embodiments, one or more die having one or more features described herein can be implemented in a packaged module. An example of such a module is shown in FIGS. 12A (plan view) and 12B (side view). A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 is shown to be mounted on the packaging substrate 812. The switching circuit 120 may include an integrated switch-filter network as disclosed herein. The die 800 can be electrically connected to other parts of the module (and with each other where more than one die is utilized) through connections, such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example, a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
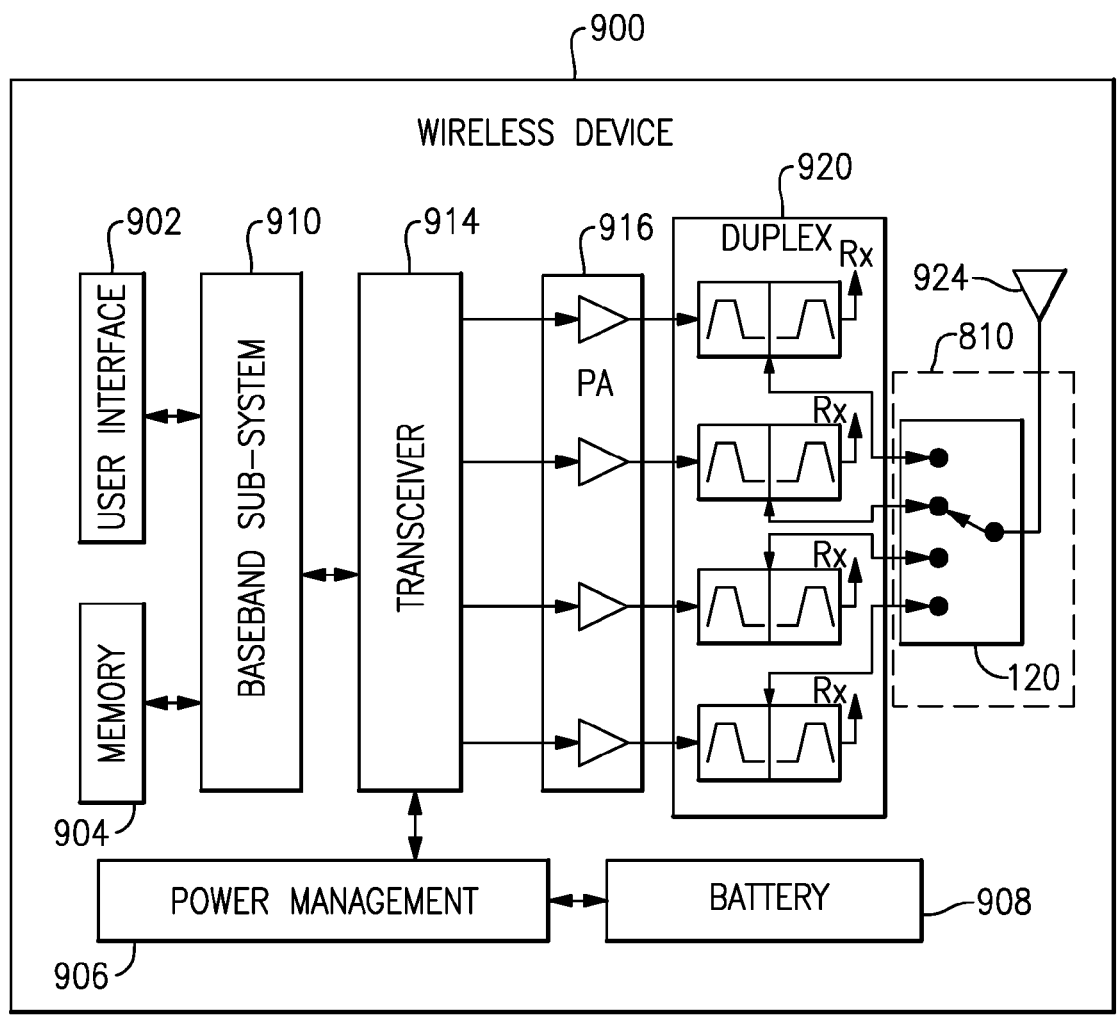
FIG. 13 shows an example wireless communication device according to one or more embodiments.

FIG. 13 schematically depicts an example wireless communication device 900 having one or more advantageous features described herein. The wireless communication device 900 may include both RF components 995 and baseband components 990. In certain embodiments, the wireless communication device 900 may include one or more switch devices having integrated switch-filter network(s) according to one or more embodiments disclosed herein.

In the example wireless device 900, a power amplifier (PA) module 901 having a plurality of PAs can provide an amplified RF signal to a switch 920, and the switch 920 can route the amplified RF signal to an antenna 916. The PA module 901 can receive an unamplified RF signal from a transceiver 914 that can be configured and operated in a known manner. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of various components of the wireless communication device 900.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, a duplexer 912a-912d can allow transmit and receive operations to be performed simultaneously using a common antenna (e.g., 916). In FIG. 13, received signals are shown to be routed to "Rx" paths (not shown) that can include, for example, one or more low-noise amplifiers (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching device comprising:
a first switch arm configured to transmit a first signal having a first wavelength $\lambda 1$;
a second switch arm configured to transmit a second signal having a second wavelength $\lambda 2$;

a common pole node connected to both the first and second switch arms;

a first shunt arm connected to the first switch arm;

a second shunt arm connected to the second switch arm;

a first transmission line disposed in the first switch arm between the common pole node at a first end of the first transmission line and the first shunt arm at a second end of the first transmission line, the first transmission line having a length of ¾ $\lambda 2$; and a second transmission line disposed in the second switch arm between the common pole node at a first end of the second transmission line and the second shunt arm at the second end of the second transmission line, the second transmission line having a length of ¼ $\lambda 1$.

2. The switching device of claim 1 wherein the first transmission line is further configured to present a substantially short circuit looking into the first switch arm from the common pole node at at least one harmonic of a fundamental frequency of the second signal.

3. The switching device of claim 2 wherein the first shunt arm includes a switch in series with a tank circuit connected to ground, the tank circuit being configured to resonate at a third harmonic of the fundamental frequency of the second signal and present a substantially short circuit to ground at the fundamental frequency of the second signal.

4. The switching device of claim 3 wherein the tank circuit includes a capacitor in parallel with an inductor.

5. The switching device of claim 1 wherein the second transmission line is configured to present a substantially open circuit looking into the second switch arm from the common pole node at a fundamental frequency of the first signal when the second switch arm is in an OFF-state and the second shunt arm is in an ON-state.

6. The switching device of claim 1 wherein the first shunt arm is connected to a plurality of transmission paths, each of the plurality of transmission paths including a switch for transmitting a signal corresponding to a different frequency band.

7. The switching device of claim 1 wherein the first transmission line includes an inductor-capacitor network.

8. The switching device of claim 7 wherein the inductor-capacitor network includes a first shunt capacitor, a second shunt capacitor, and an inductor disposed between the first and second shunt capacitors.

9. A switching circuit comprising:

a first switch arm configured to transmit a first signal having a first wavelength $\lambda 1$, the first switch arm including a first switch;

a second switch arm configured to transmit a second signal having a second wavelength $\lambda 2$, the second switch arm including a second switch;

a common pole node connected to both the first switch arm and the second switch arm;

a first shunt arm connected to the first switch arm between the pole node and the first switch;

a second shunt arm connected to the second switch arm between the pole node and the second switch;

a first transmission line disposed in the first switch arm between the common pole node at a first end of the first transmission line and the first shunt arm at a second end of the first transmission line, the first transmission line having a length of ¾ $\lambda 2$; and a second transmission line disposed in the second switch arm between the common pole node at a first end of the second transmission line and the second shunt arm at the second end of the second transmission line, the second transmission line having a length of ¼ $\lambda 1$.

10. The switching circuit of claim 9 wherein the first transmission line is further configured to present a substantially short circuit looking into the first switch arm from the common pole node at at least one harmonic of a fundamental frequency of the second signal.

11. The switching circuit of claim 10 wherein the first shunt arm includes a switch in series with a tank circuit connected to ground, the tank circuit being configured to resonate at the at a third harmonic of the fundamental frequency of the second signal and present a substantially short circuit to ground at the fundamental frequency of the second signal.

12. The switching circuit of claim 11 wherein the tank circuit includes a capacitor in parallel with an inductor.

13. The switching circuit of claim 9 wherein the second transmission line is configured to present a substantially open circuit looking into the second switch arm from the common pole node at a fundamental frequency of the first signal when the second switch arm is in an OFF-state and the second shunt arm is in an ON-state.

14. The switching circuit of claim 13 wherein the first signal corresponds to band 8 of the LTE spectrum and the second signal corresponds to band 17 of the LTE spectrum.

15. A wireless device comprising:

an antenna configured to transmit a radio-frequency output signal;

a first switch arm coupled to the antenna via a pole node, the first switch arm being configured to transmit a first signal having a first wavelength $\lambda 1$ and including a first switch;

a second switch arm coupled to the antenna via the pole node, the second switch arm being configured to transmit a second signal having a second wavelength $\lambda 2$ and including a second switch;

a first shunt arm connected to the first switch arm between the pole node and the first switch;

a second shunt arm connected to the second switch arm between the pole node and the second switch;

a first transmission line disposed in the first switch arm between the pole node at a first end of the first transmission line and the first switch and the first shunt arm at a second end of the first transmission line, the first transmission line having a length of ¾ $\lambda 2$; and a second transmission line disposed in the second switch arm between the pole node at a first end of the second transmission line and the second shunt arm at the second end of the second transmission line, the second transmission line having a length of ¼ $\lambda 1$.

* * * * *